US009013879B2

United States Patent
Farner et al.

(10) Patent No.: US 9,013,879 B2
(45) Date of Patent: Apr. 21, 2015

(54) ELECTRONIC COMPONENT COOLING HOOD AND HEAT PIPE

(71) Applicant: Hamilton Sundstrand Corporation, Windsor Locks, CT (US)

(72) Inventors: Rachel Farner, Springfield, MA (US); Kenneth J. Trotman, Granby, CT (US); Jay W. Kokas, East Granby, CT (US); Kerry R. Querns, Durham, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 337 days.

(21) Appl. No.: 13/693,494

(22) Filed: Dec. 4, 2012

(65) Prior Publication Data

US 2014/0153191 A1 Jun. 5, 2014

(51) Int. Cl.
*H05K 7/20* (2006.01)
*H01L 23/473* (2006.01)

(52) U.S. Cl.
CPC .... *H05K 7/20336* (2013.01); *H01L 2924/0002* (2013.01)

(58) Field of Classification Search
CPC ............. H05K 7/20; H05K 7/20218–7/20381; H01L 23/473
USPC ......................... 361/679.46–679.54, 688–723, 361/676–678; 165/80.1–80.3, 104.33, 185; 174/15.1–15.3, 16.1–16.3, 547–548; 257/712–722, E23.088
See application file for complete search history.

(56) References Cited

U.S. PATENT DOCUMENTS

| | | | |
|---|---|---|---|
| 4,019,098 A | 4/1977 | McCready et al. | |
| 4,114,756 A | 9/1978 | Dacey et al. | |
| 5,982,616 A | 11/1999 | Moore | |
| 6,130,818 A | 10/2000 | Severson | |
| 6,148,906 A | 11/2000 | Li et al. | |
| 6,519,154 B1 * | 2/2003 | Chiu | 361/704 |
| 6,665,187 B1 * | 12/2003 | Alcoe et al. | 361/719 |
| 6,685,447 B2 | 2/2004 | Mabe et al. | |
| 6,977,818 B1 * | 12/2005 | Depew | 361/719 |
| 7,453,678 B2 | 11/2008 | Beneditz et al. | |
| 7,492,594 B2 | 2/2009 | Pal | |
| 7,652,885 B2 | 1/2010 | Tomioka | |
| 7,738,248 B2 | 6/2010 | Tomioka | |

(Continued)

OTHER PUBLICATIONS

United Kingdom Search Report for United Kingdom Patent Application No. 1320335.1 completed on Apr. 28, 2014.

*Primary Examiner* — Michail V Datskovskiy
*Assistant Examiner* — Razmeen Gafur
(74) *Attorney, Agent, or Firm* — Carlson, Gaskey & Olds, PC

(57) ABSTRACT

An electronic component and cooling system has a printed wiring board, which is planar. An electrical component is mounted on one side of the planar surface of the printed wiring board. A hood is positioned outwardly of the electronic component. Legs on the hood extend to the printed wiring board, and form an inner surface that is positioned away from the one side relative to the electrical component. A chassis has posts connected to the printed wiring board and on an opposed side of the planar surface of the printed wiring board from the electrical component. The chassis extends to a remote portion, beyond the printed wiring board. A heat pipe is generally elongate and positioned on an opposed side of the hood from the electrical component. The heat pipe extends to the remote portion of the chassis to transfer heat from the hood to the chassis.

17 Claims, 2 Drawing Sheets

(56) References Cited

U.S. PATENT DOCUMENTS

| | | | |
|---|---|---|---|
| 7,742,299 B2* | 6/2010 | Sauciuc et al. | 361/695 |
| 7,746,638 B2* | 6/2010 | Takawa et al. | 361/690 |
| 8,031,469 B2* | 10/2011 | Tomioka et al. | 361/700 |
| 8,804,331 B2* | 8/2014 | Refai-Ahmed | 361/679.54 |
| 2002/0105781 A1* | 8/2002 | Ohashi et al. | 361/687 |
| 2002/0126453 A1* | 9/2002 | Ubukata | 361/720 |
| 2003/0151895 A1* | 8/2003 | Zuo | 361/699 |
| 2004/0042171 A1* | 3/2004 | Takamatsu et al. | 361/687 |
| 2005/0201060 A1* | 9/2005 | Huang | 361/700 |
| 2005/0274487 A1* | 12/2005 | Goth | 165/80.2 |
| 2006/0133043 A1* | 6/2006 | Boudreaux et al. | 361/704 |
| 2007/0171616 A1 | 7/2007 | Peng et al. | |
| 2007/0263355 A1 | 11/2007 | Yu et al. | |
| 2008/0053640 A1* | 3/2008 | Mok | 165/104.33 |
| 2008/0310117 A1* | 12/2008 | Coico et al. | 361/709 |
| 2009/0244840 A1* | 10/2009 | Takawa et al. | 361/695 |
| 2009/0316366 A1* | 12/2009 | Mullen et al. | 361/717 |
| 2011/0096507 A1* | 4/2011 | Deram | 361/718 |
| 2011/0194255 A1* | 8/2011 | Yamashita et al. | 361/711 |
| 2011/0249400 A1* | 10/2011 | Watanabe et al. | 361/695 |

* cited by examiner

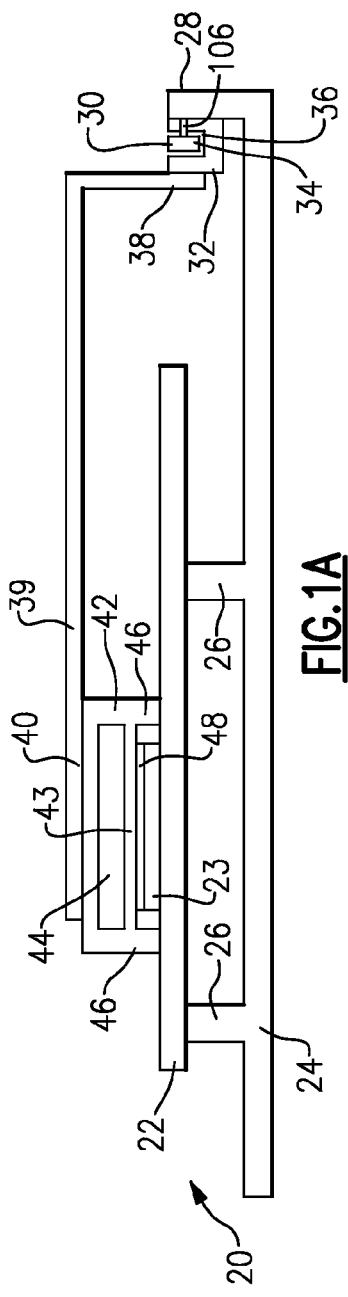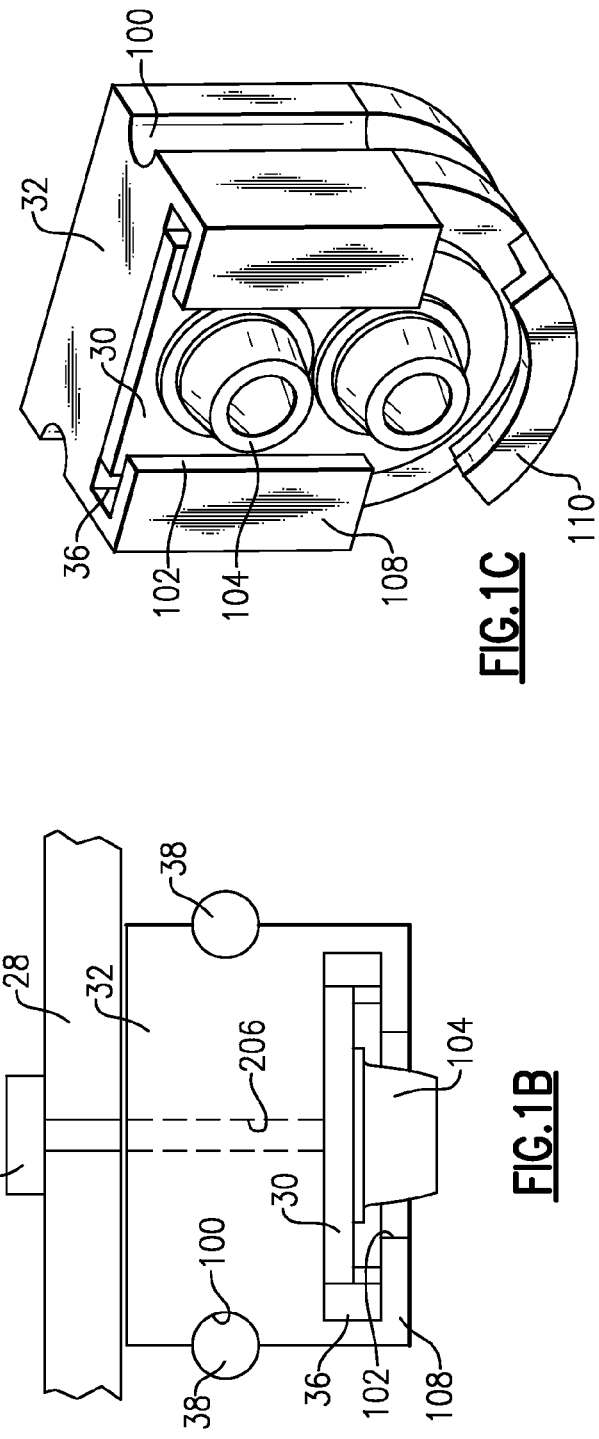

ELECTRONIC COMPONENT COOLING HOOD AND HEAT PIPE

BACKGROUND

This application relates to an arrangement for cooling an electronic component mounted on a printed circuit board, utilizing a hood, and an attached heat pipe to transfer heat to a remote location on a cooling chassis.

Electronic components are becoming increasingly complex and powerful. As the complexity and power increase so does waste heat generated by the electronic components. Any number of cooling strategies have been developed to cool the electronic components.

In one strategy, a chassis provides a heat sink, and the electronic component is mounted directly to a printed wiring board. A post on the chassis connects to the printed wiring board and heat moves through the board to the post, to the heatsink contained as part of the chassis. However, the thermal resistance associated with both the board and the post limits the cooling ability of the chassis/heatsink.

SUMMARY

An electronic component and cooling system has a printed wiring board, which is planar. An electrical component is mounted on one side of the planar surface of the printed wiring board. A hood is positioned on the printed wiring board outwardly of the electronic component. Legs on the hood extend to be in contact with the printed wiring board, and form an inner surface that is positioned away from the one side relative to the electrical component. A chassis has posts connected to the printed wiring board and on an opposed side of the planar surface of the printed wiring board from the electrical component. The chassis extends to a remote portion, beyond the printed wiring board. A heat pipe is generally elongate and positioned on an opposed side of the hood from the electrical component. The heat pipe extends to the remote portion of the chassis to transfer heat from the hood to the chassis.

These and other features of this application may be best understood from the following drawings and specification.

BRIEF DESCRIPTION OF THE DRAWINGS

FIG. 1A is a view showing a first embodiment.

FIG. 1B is a top view showing a feature of the first embodiment.

FIG. 1C is an isometric view showing more detail of the FIG. 1B feature.

DETAILED DESCRIPTION

Figure 2:
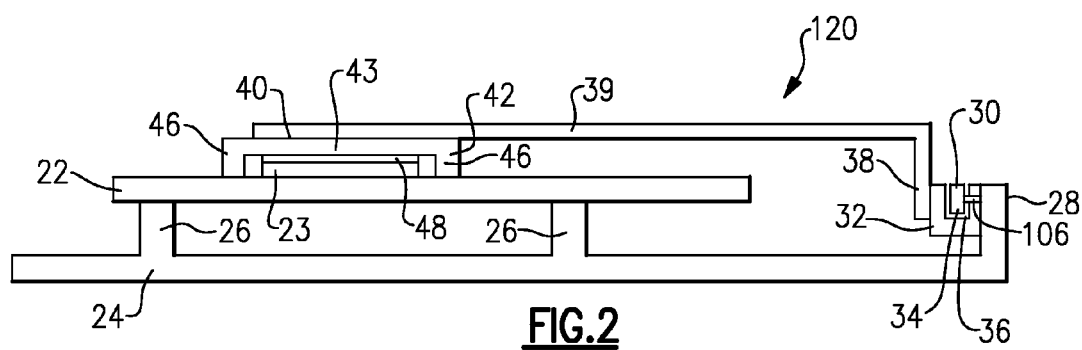
FIG. 2 is a view showing a second embodiment.

FIG. 1 shows a cooling system 20 for cooling an electronic component 23. Electronic component 23 is attached to a printed wiring board 22. The electronic component 23 may be a power controller or any other type of electronic component requiring thermal management.

A thermal pad 48 may transfer heat from the component 23 into a hood 42. Hood 42 has legs 46 which contact the printed wiring board 22. Surface 43 between the legs 46 is in contact with the thermal pad 48. A heat pipe 39 is attached at surface 40 of the hood 42.

In one embodiment (FIG. 1A), a phase transition material 44 is received within a body of the hood 42. A phase transition material is a material which will change physical states when encountering heat, and provides short term absorption of heat under certain conditions when the operation of the heat pipe 39 and hood 42 might not be as efficient as others. As an example, the system 20 may be utilized in aero-space applications, and may be subject to challenging orientations or g-force loading. At such time, phase transition material 44 may carry a share of the cooling load.

The heat pipe 39 extends to a mounting bracket 32. The mounting bracket 32 is fixed to an end leg 38 of the heat pipe 39. A nut plate 30 is located within the mounting bracket 32. The nut plate 30 is allowed to move freely within the mounting bracket 32. Mounting bracket 32 is mounted to chassis 24, and in particular an end ledge 28 of the chassis 24. The nut plate 30 is retained into a channel 36 in mounting bracket 32. Preferably, the tip 34 is closely received within the mounting bracket channel 36, however, since they are not fixed together there is freedom to move in at least two directions. This will account for the stackup of assembly tolerances. The remote leg end 38 of the heat pipe 39 is bent toward the planar edge of the chassis 24 as shown.

FIG. 1A (and FIG. 2) show the detail of the mounting bracket 32, and the nut plate 30 in oversimplified detail. In fact, one embodiment of this connection is best shown in FIGS. 1B and 1C.

As shown in FIG. 1B, the chassis remote portion 28 is secured to a nut plate 30 through a bolt 106 extending into a nut 104 which is fixed to nut plate 30. The channel 36 is shown between ears 108 defining channel opening 102. Channels 100 at sides of the mounting bracket 32 receive the heat pipes 38. As can be appreciated from this Figure, the nut plate 30 would be able to move relative to mounting bracket 32 both to the right and left in this Figure, and into and out of the plane of the page.

FIG. 1C shows further details of the mounting bracket 32, and the nut plate 30 along with the nuts 104. The ears 108 can be seen to be spaced to provide the opening 102. A bottom retaining feature 110 is also shown. This feature assists in retaining nut plate 30.

FIG. 2 shows an embodiment 120 wherein the phase transition material 44 is not utilized.

Figure 3:
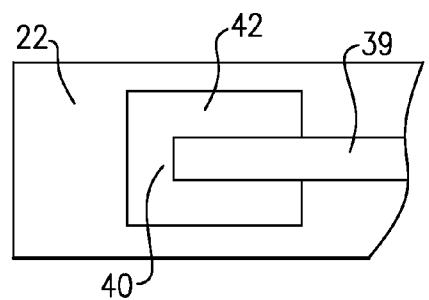
FIG. 3 is a top view showing a detail of both the first and second embodiments.

FIG. 3 shows another view, and in particular the fact that the printed wiring board 22 receives the hood 42 and the heat pipe 39 is placed on the hood 42. As can be appreciated from FIG. 1 (i.e., FIG. 3 is a view from top in FIG. 1 and FIG. 2), the printed wiring board 22 extends for a greater dimension then does the hood 42 along a longest dimension of the heat pipe 39. This is also evident from FIG. 3. The heat pipe 39 is generally an elongate member, and is thus not as wide as either the printed wiring board 22 or the hood 42 as is shown in FIG. 3.

In embodiments, the hood 42 may be formed of aluminum, the heat pipe 39 may be formed of copper, the components of the mounting bracket 32 and the chassis 24 may be also formed of aluminum. Other suitable materials could also be used.

The phase transition material may be formed of wax impregnated metal mesh, or a number of other phase change material technologies/configurations. The thermal pad is preferably formed of a material that is a good heat conductor, but that is also compressible. One known material may be Berquist Gap Pad 5000™, although many other similar and suitable thermal pad materials could be used.

The hood 42 minimizes mechanical stresses on sensitive electronic components due to the thermal pad 48 interface.

Further, having the hood 42 enclose the electrical component 23 prevents any need for special alignment during assembly, and protects the thermal pad 48 from environmental and chemical concerns, as well as accumulation of debris. Since the hood is mounted to the printed wiring board, rather than the chassis, it provides support and strain relief for the heat pipe 39. While one heat pipe is illustrated, it should be understood there may be a plurality of heat pipes, and in many applications there would be two or more heat pipes.

Also, the attachment of the hood 42 directly to the printed wiring board, provides stiffening to the printed wiring board, which may improve component life.

In general, an electronic component and cooling system 20/120 has a printed wiring board 22, which is planar. An electrical component 23 is mounted on one side of the planar surface of the printed wiring board 22. A hood 42 is positioned on the printed wiring board outwardly of the electronic component. Legs 46 on the hood extend to be in contact with the printed wiring board, and form an inner surface that is positioned away from the one side relative to the electrical component. A chassis 24 has posts 26 connected to the printed wiring board and on an opposed side of the planar surface of the printed wiring board from the electrical component. The chassis extends to a remote portion 28, beyond the printed wiring board 22. A heat pipe 39 is generally elongate and positioned on an opposed side of the hood 42 from the electrical component. The heat pipe 39 extends to the remote portion 28 of the chassis to transfer heat from the hood to the chassis.

Although embodiments have been disclosed, a worker of ordinary skill in the art would recognize that certain modifications would come within the scope of this invention. For that reason the following claims should be studied to determine the true scope and content of this invention.

The invention claimed is:

1. An electronic component and cooling system comprising:
   a printed wiring board, said printed wiring board being generally planar, and with an electrical component mounted on one side of said planar surface of said printed wiring board;
   a hood positioned on said printed wiring board, and outwardly of said electronic component, said hood having legs extending to be in contact with said printed wiring board, and forming an inner surface which is positioned away from said one side relative to said electrical component;
   a chassis having posts connected to said printed wiring board and on an opposed side of said planar surface of said printed wiring board from said electrical component, said chassis extending to a remote portion, beyond said printed wiring board; and
   a heat pipe, said heat pipe being generally elongate and positioned on an opposed side of said hood from said electrical component, said heat pipe extending to said remote portion of said chassis to transfer heat from said hood to said chassis.

2. The system set forth in claim 1, wherein said heat pipe is connected to said remote portion of said chassis through a connection that allows relative movement in at least two directions between said heat pipe and said chassis.

3. The system as set forth in claim 2, wherein one of said heat pipe and said remote portion of said chassis is connected to a mounting bracket having a channel, and the other of said heat pipe and said remote portion of said chassis is connected to a nut plate movable within said channel to allow said relative movement in at least two directions.

4. The system as set forth in claim 3, wherein said heat pipe is connected to said mounting bracket having said channel, and said nut plate is secured to said remote portion of said chassis.

5. The system as set forth in claim 3, wherein said mounting bracket has a pair of ears defining lateral sides, and a bottom retaining feature, and said channel being defined on a remote side of said ears and said bottom retaining feature relative to said remote portion of said chassis.

6. The system as set forth in claim 5, wherein said nut plate receives a nut, and is bolted to said remote portion of said chassis by a bolt extending into said nut.

7. The system as set forth in claim 6, wherein said ears are spaced such that said bolt is free to move within a space between said ears and said bottom retaining feature.

8. The system as set forth in claim 4, wherein there are recesses at each of two opposed sides of said mounting bracket which each receive a heat pipe.

9. The system as set forth in claim 1, wherein said printed wiring board extends for a greater axial distance then does said hood, and said heat pipe extending for a greater axial distance along an elongate axial length of said heat pipe then both said hood and said printed wiring board.

10. The system as set forth in claim 9, wherein a width may be defined perpendicular to said axial length, and both said printed wiring board and said hood having a greater width than said heat pipe.

11. The system as set forth in claim 1, wherein said heat pipe is formed of copper, and said hood is formed of aluminium.

12. The system as set forth in claim 11, wherein said chassis is also formed of aluminium.

13. The system as set forth in claim 1, wherein said hood has an internal cavity receiving a phase transition material that can change phase to support heat transfer during challenging operational points in the operation for said electrical component and cooling system.

14. The system as set forth in claim 1, wherein a compressible thermal pad is positioned between said under-surface of said hood and said electrical component.

15. An electronic component and cooling system comprising:
   a printed wiring board, said printed wiring board being generally planar, and with an electrical component mounted on one side of said planar surface of said printed wiring board;
   a hood positioned on said printed wiring board, and outwardly of said electronic component, said hood having legs extending to be in contact with said printed wiring board, and forming an inner surface which is positioned away from said one side relative to said electrical component;
   a chassis having posts connected to said printed wiring board and on an opposed side of said planar surface of said printed wiring board from said electrical component, said chassis extending to a remote portion, beyond said printed wiring board;
   a heat pipe, said heat pipe being generally elongate and positioned on an opposed side of said hood from said electrical component, said heat pipe extending to said remote portion of said chassis to transfer heat from said hood to said chassis;
   said heat pipe being connected to a mounting bracket, and said mounting bracket retains said nut plate having a tip extending into a channel in the mounting bracket allows relative movement in at least two directions between said heat pipe and said chassis;

said printed wiring board extending for a greater axial distance then does said hood, and said heat pipe extending for a greater axial distance along an elongate axial length of said heat pipe then both said hood and said printed wiring board;

a width may be defined perpendicular to said axial length, and both said printed wiring board and said hood having a greater width than said heat pipe; and a compressible thermal pad being positioned between said under-surface of said hood and said electrical component.

16. The system as set forth in claim 15, wherein said heat pipe is formed of copper, and said hood is formed of aluminium.

17. The system as set forth in claim 16, wherein said chassis is also formed of aluminium.

* * * * *